United States Patent
Kudo et al.

(10) Patent No.: US 11,418,050 B2
(45) Date of Patent: Aug. 16, 2022

(54) METHOD FOR CONTROLLING DISCHARGE OF POWER STORAGE DEVICE

(71) Applicant: Panasonic Intellectual Property Management Co., Ltd., Osaka (JP)

(72) Inventors: Takahiro Kudo, Kyoto (JP); Yoshimitsu Odajima, Osaka (JP); Yohsuke Mitani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 19 days.

(21) Appl. No.: 17/060,570

(22) Filed: Oct. 1, 2020

(65) Prior Publication Data

US 2021/0021148 A1    Jan. 21, 2021

Related U.S. Application Data

(63) Continuation of application No. 16/114,581, filed on Aug. 28, 2018, now Pat. No. 10,833,527, which is a
(Continued)

(30) Foreign Application Priority Data

Mar. 17, 2016  (JP) .............................. JP2016-054334

(51) Int. Cl.
*H02J 7/34* (2006.01)
*H02J 7/00* (2006.01)
(Continued)

(52) U.S. Cl.
CPC .............. *H02J 7/345* (2013.01); *G05F 3/26* (2013.01); *H01L 29/866* (2013.01); *H02J 7/00* (2013.01);
(Continued)

(58) Field of Classification Search
CPC ....................................................... H02J 7/345
(Continued)

(56) References Cited

U.S. PATENT DOCUMENTS

2008/0169791 A1* 7/2008 Daio ................. H02J 7/025
320/166
2011/0163800 A1* 7/2011 Soma ................ H03K 17/163
327/543

FOREIGN PATENT DOCUMENTS

| JP | 57-118417 U | 7/1982 |
|----|-------------|--------|
| JP | 2008-178202 | 7/2008 |
| JP | 2009-112156 | 5/2009 |

OTHER PUBLICATIONS

International Search Report of PCT application No. PCT/JP2017/001885 dated Feb. 14, 2017.
(Continued)

*Primary Examiner* — Edward Tso
*Assistant Examiner* — Ahmed H Omar
(74) *Attorney, Agent, or Firm* — McDermott Will & Emery LLP

(57) ABSTRACT

A method for controlling a discharge of a power storage device includes: a first step of discharging, in a first section of a discharging period, a part of an electric charge stored in a power storage through a first discharge path and a second discharge path of a discharge circuit; and a second step of discharging, in a second section of the discharging period, a remaining part of the electric charge through the second discharge path. The first discharge path includes a zener diode connected to one end of the power storage. The second discharge path includes a first transistor connected to the one end of the power storage. The first section is a period in which a voltage of the one end of the power storage is higher than a breakdown voltage of the zener diode. The second section is a period in which a voltage of the one end of the
(Continued)

power storage is lower than the breakdown voltage of the zener diode. An output current of the first transistor in the second section is greater than an output current of the first transistor in the first section.

19 Claims, 3 Drawing Sheets

Related U.S. Application Data continuation of application No. PCT/JP2017/001885, filed on Jan. 20, 2017.

(51) Int. Cl.
*H02J 50/05* (2016.01)
*G05F 3/26* (2006.01)
*H01L 29/866* (2006.01)
*H02J 7/02* (2016.01)
*H02M 3/338* (2006.01)

(52) U.S. Cl.
CPC .............. *H02J 7/025* (2013.01); *H02J 50/05* (2016.02); *H02M 3/3385* (2013.01)

(58) Field of Classification Search
USPC .......................................... 320/166
See application file for complete search history.

(56) References Cited

OTHER PUBLICATIONS

Non-Final Office Action issued in U.S. Appl. No. 16/114,681, dated Mar. 19, 2020.
Notice of Allowance issued in U.S. Appl. No. 16/114,581, dated Jul. 1, 2020.
Non-Final Office Action issued in U.S. Appl. No. 16/114,581, dated Mar. 19, 2020.

* cited by examiner

METHOD FOR CONTROLLING DISCHARGE OF POWER STORAGE DEVICE

CROSS-REFERENCE OF RELATED APPLICATIONS

This application is a Continuation of the U.S. patent application Ser. No. 16/114,581, filed on Aug. 18, 2018, which is now U.S. Pat. No. 10,833,527, which is a continuation of the PCT International Patent Application No. PCT/JP2017/001885 filed on Jan. 20, 2017, which claims the benefit of Japanese patent application No. 2016-054334 filed on Mar. 17, 2016, the entire disclosures of which Applications are incorporated by reference herein.

TECHNICAL FIELD

The present disclosure relates to a method for controlling a discharge of an electric charge stored in a capacitor of a power storage device.

BACKGROUND

Heretofore, there has been known a discharge circuit for discharging power charged in a capacitor in a power conversion apparatus such as an inverter apparatus.

As an example of this type of discharge circuit, a constant power discharge circuit is disclosed (refer to Unexamined Japanese Patent Publication No. 2009-112156). The constant power discharge circuit includes: a transistor capable of adjusting a discharge current by a gate voltage; and a shunt resistor that allows a flow of the discharge current adjusted by the transistor and outputs a reference voltage. The constant power discharge circuit decides discharge current setting values in response to a discharge voltage that gradually decreases due to the discharge. Moreover, the constant power discharge circuit compares one of the discharge current setting values selected in response to a residual voltage of the capacitor and the discharge current obtained from the reference voltage with each other and controls the gate voltage such that the discharge current becomes equal to the discharge current setting value.

SUMMARY

A method for controlling a discharge of a power storage device, the power storage device including a power storage and a discharge circuit, the method includes: a first step of discharging, in a first section of a discharging period, a part of an electric charge stored in the power storage through a first discharge path and a second discharge path which are included in the discharge circuit; and a second step of discharging, in a second section of the discharging period, a remaining part of the electric charge stored in the power storage through the second discharge path. The first discharge path includes a zener diode connected to one end of the power storage. The second discharge path includes a first transistor connected to the one end of the power storage at a first input terminal of the first transistor. The first section is a period in which a voltage of the one end of the power storage is higher than a breakdown voltage of the zener diode. The second section is a period in which a voltage of the one end of the power storage is lower than the breakdown voltage of the zener diode. An output current of the first transistor in the second section is greater than an output current of the first transistor in the first section.

In accordance with the present disclosure, a control of the discharge of the power storage device that performs discharge approximating constant power discharge can be realized with a simple configuration. Accordingly, a power storage device capable of decreasing size and cost can be implemented.

DESCRIPTION OF EMBODIMENT

Figure 1:
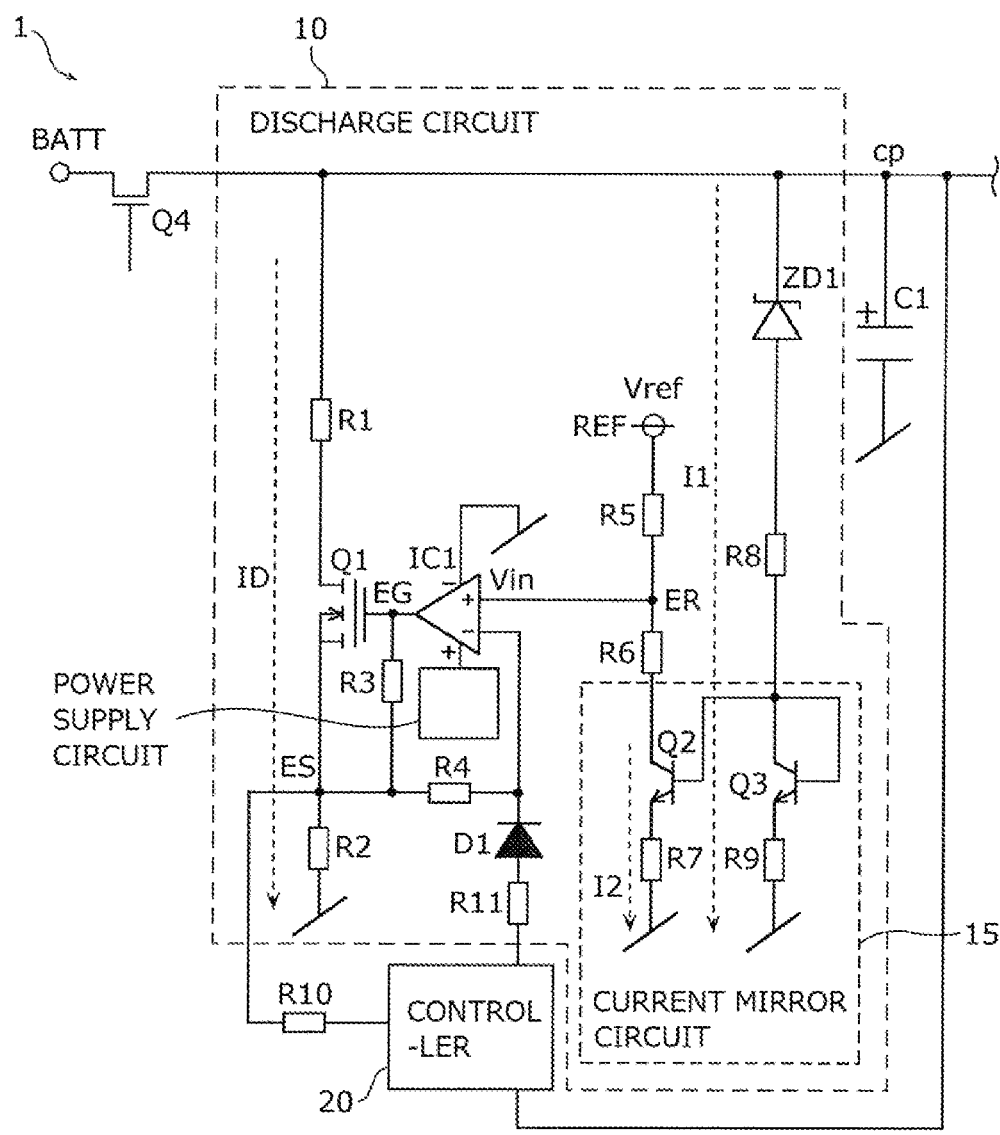
FIG. 1 is a circuit diagram illustrating a discharge circuit and a power storage device according to an exemplary embodiment of the present disclosure.

In the discharge circuit disclosed in Unexamined Japanese Patent Publication No. 2009-112156, it is necessary to provide the discharge current setting value for each of predetermined sections on a waveform of the residual voltage of the capacitor, and further, to control the gate voltage such that the actual discharge current becomes equal to the discharge current setting value.

In this connection, the present disclosure provides a method that controls a discharge current of a capacitor with a simple configuration without providing the foregoing discharge current setting values.

Hereinafter, a discharge circuit and a power storage device according to an exemplary embodiment of the present disclosure will be described with reference to the drawings. The exemplary embodiment described below is a preferred specific example of the present disclosure. Numeric values, shapes, materials, constituents, dispositions and connection modes of the constituents, and the like, which are shown in the following exemplary embodiment, are merely examples, and are not intended to limit the present disclosure. Accordingly, among the constituents in the following exemplary embodiment, constituents which are not recited in the independent claim for the most generic concept of the present disclosure are described as arbitrary constituents.

The drawings are also schematic diagrams and are not always exactly illustrated. In the drawings, substantially the same constituents are denoted by the same reference numerals, and a redundant description is omitted or simplified as appropriate.

Moreover, in the following exemplary embodiment, "connected" means to be electrically connected, and includes not only the case of being directly connected but also being indirectly connected via another electric element or the like.

Exemplary Embodiment

[Configuration of Power Storage Device and Discharge Circuit]

FIG. 1 is a circuit diagram illustrating discharge circuit 10 and power storage device 1 according to the exemplary embodiment of the present disclosure.

Power storage device 1 according to the present exemplary embodiment, for example, is described by taking power storage device 1 mounted on a vehicle such as an automobile as an example.

Power storage device 1 according to the present exemplary embodiment includes: battery BATT mounted on the vehicle; capacitor $C_1$ connected to battery BATT; discharge circuit 10 connected to capacitor $C_1$; and controller 20. Here, capacitor $C_1$ is an example of a power storage of the present disclosure.

Battery BATT is connected to one end (positive electrode) cp of capacitor $C_1$ via switch $Q_4$. For example, switch $Q_4$ is composed of a field effect transistor (FET). Capacitor $C_1$ is charged by turning on switch $Q_4$, and stops being charged by turning off switch $Q_4$. Moreover, the other end (negative electrode) of capacitor $C_1$ is grounded.

Discharge circuit 10 is used for discharging power charged in capacitor $C_1$. Discharge circuit 10 includes: transistor $Q_1$ for controlling the discharge current of capacitor $C_1$; operational amplifier $IC_1$ for controlling an output current of transistor $Q_1$; current mirror circuit 15 connected to non-inverting input terminal (V+) of operational amplifier IC; zener diode $ZD_1$ connected to an input side of current mirror circuit 15; and reference power supply REF connected to an output side of current mirror circuit 15. Note that transistor $Q_1$ is an example of a first transistor of the present disclosure. Moreover, reference power supply REF is an example of a current source of the present disclosure.

In the present exemplary embodiment, transistor $Q_1$ is an n-channel FET. A current input terminal (drain) of transistor $Q_1$ is connected to one end cp of capacitor $C_1$ via resistor $R_1$, and a current output terminal (source) of transistor $Q_1$ is grounded via resistor $R_2$. An output terminal of operational amplifier $IC_1$ is connected to a control terminal (gate) of transistor $Q_1$, and operational amplifier $IC_1$ controls a voltage to be applied to the gate of transistor $Q_1$. In this way, magnitude of drain current $I_D$ flowing between two current terminals (between the drain and the source) is controlled. Note that the source of transistor $Q_1$ is an example of an output terminal of the present disclosure.

The output terminal of operational amplifier $IC_1$ is connected to inverting input terminal (V−) of operational amplifier $IC_1$ via resistors $R_3$ and $R_4$.

Current mirror circuit 15 is a circuit for flowing, through an output side, a current of the same value as that of a current flowing through an input side. Current mirror circuit 15 includes transistors $Q_2$ and $Q_3$. Bases of transistors $Q_2$ and $Q_3$ are connected to each other, and the base and collector of transistor $Q_3$ are also connected to each other. Here, when transistor $Q_2$ is on the output side, transistor $Q_3$ is on the input side, and current $I_1$ flows between the collector and emitter of transistor $Q_3$, then current $I_2$ of substantially the same magnitude also flows between a collector and emitter of transistor $Q_2$ ($I_1 \approx I_2$). Note that transistors $Q_2$ and $Q_3$ are examples of second and third transistors of the present disclosure.

Reference power supply REF for outputting a constant voltage is connected to the collector of transistor $Q_2$ via resistors $R_5$ and $R_6$. The emitter of transistor $Q_2$ is grounded via resistor $R_7$. Moreover, non-inverting input terminal (V+) of operational amplifier $IC_1$ is connected to a node ER between resistor $R_5$ and resistor $R_6$.

An anode of zener diode $ZD_1$ is connected to the collector of transistor $Q_3$ via resistor $R_8$, and a cathode of zener diode $ZD_1$ is connected to one end cp of capacitor $C_1$. The emitter of transistor $Q_3$ is grounded via resistor $R_9$. Note that resistors $R_8$ and $R_9$ are resistors for limiting a current flowing through zener diode $ZD_1$.

Figure 2:
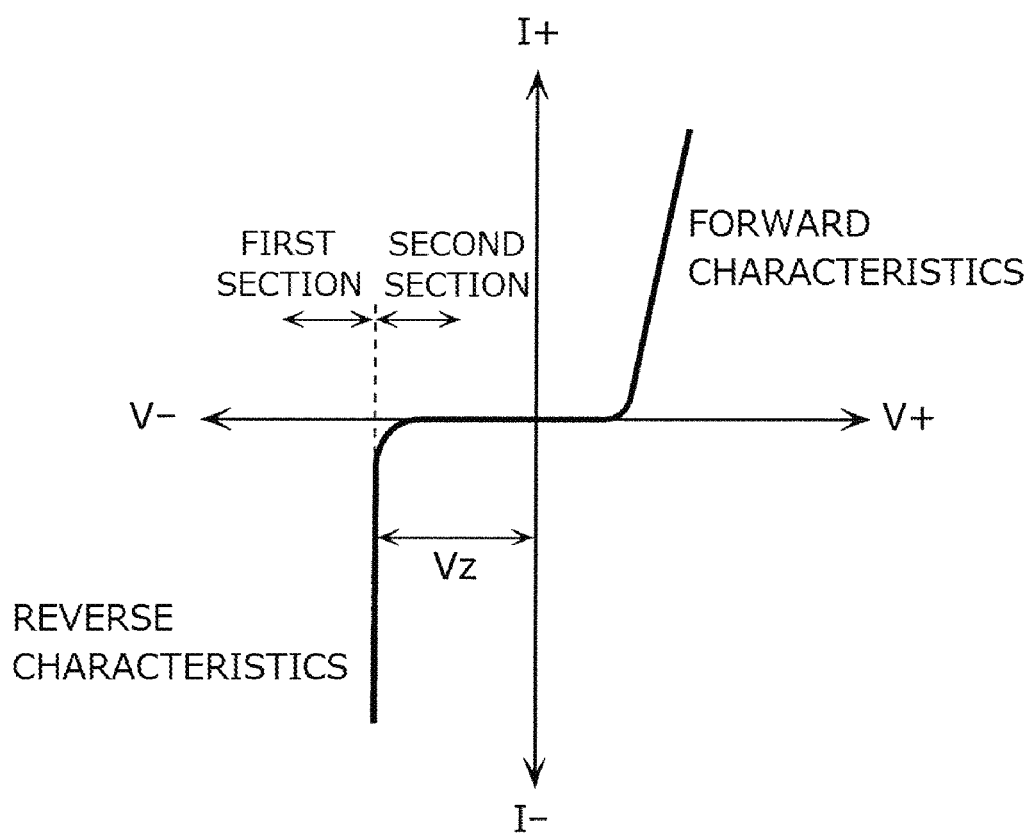
FIG. 2 is a schematic graph showing diode characteristics of a zener diode provided in the discharge circuit.

FIG. 2 is a schematic graph showing diode characteristics of zener diode $ZD_1$ provided in discharge circuit 10. As illustrated in FIG. 2, when a voltage of capacitor $C_1$ is larger than breakdown voltage $V_Z$ of zener diode $ZD_1$ (first section), current $I_1$ flows through zener diode $ZD_1$ with ease. $I_1$ is maintained at a constant value until the voltage of capacitor $C_1$ reaches $V_Z$ due to a general feature of the zener diode. Moreover, when the voltage of capacitor $C_1$ is smaller than breakdown voltage $V_Z$ (second section), current $I_1$ flowing through zener diode $ZD_1$ decreases exponentially.

An output terminal of controller 20 is connected to inverting input terminal (V−) of operational amplifier $IC_1$ via resistor $R_{11}$ and diode $D_1$. One of input terminals of controller 20 is connected to the source of transistor $Q_1$ via resistor $R_{10}$, and the other of the input terminals of controller 20 is connected to one end cp of capacitor $C_1$. In this way, controller 20 can measure source voltage ES of transistor $Q_1$ and the voltage of capacitor $C_1$. Resistor $R_{10}$ is a protective resistor for protecting controller 20.

As described above, power storage device 1 of the present exemplary embodiment is configured.

[Operations of Power Storage Device and Discharge Circuit]

Next, a description will be given of operations of power storage device 1 and discharge circuit 10 according to the exemplary embodiment of the present disclosure.

Battery BATT is used for supplying power to an engine starter and an in-vehicle electrical instrument and for charging capacitor $C_1$. Capacitor $C_1$ is used in place of (or for backup of) battery BATT. Accordingly, when battery BATT is capable of supplying power to the in-vehicle instrument, for example, when an ignition key of the vehicle is turned on, then capacitor $C_1$ is fully charged by supplying power to battery BATT. However, when capacitor $C_1$ continues to be fully charged for a long time, then capacitor $C_1$ receives a stress and is prone to deteriorate. Accordingly, it is preferable that capacitor $C_1$ is discharged when power storage device 1 is not used (for example, when the ignition key is turned off).

Figure 3:
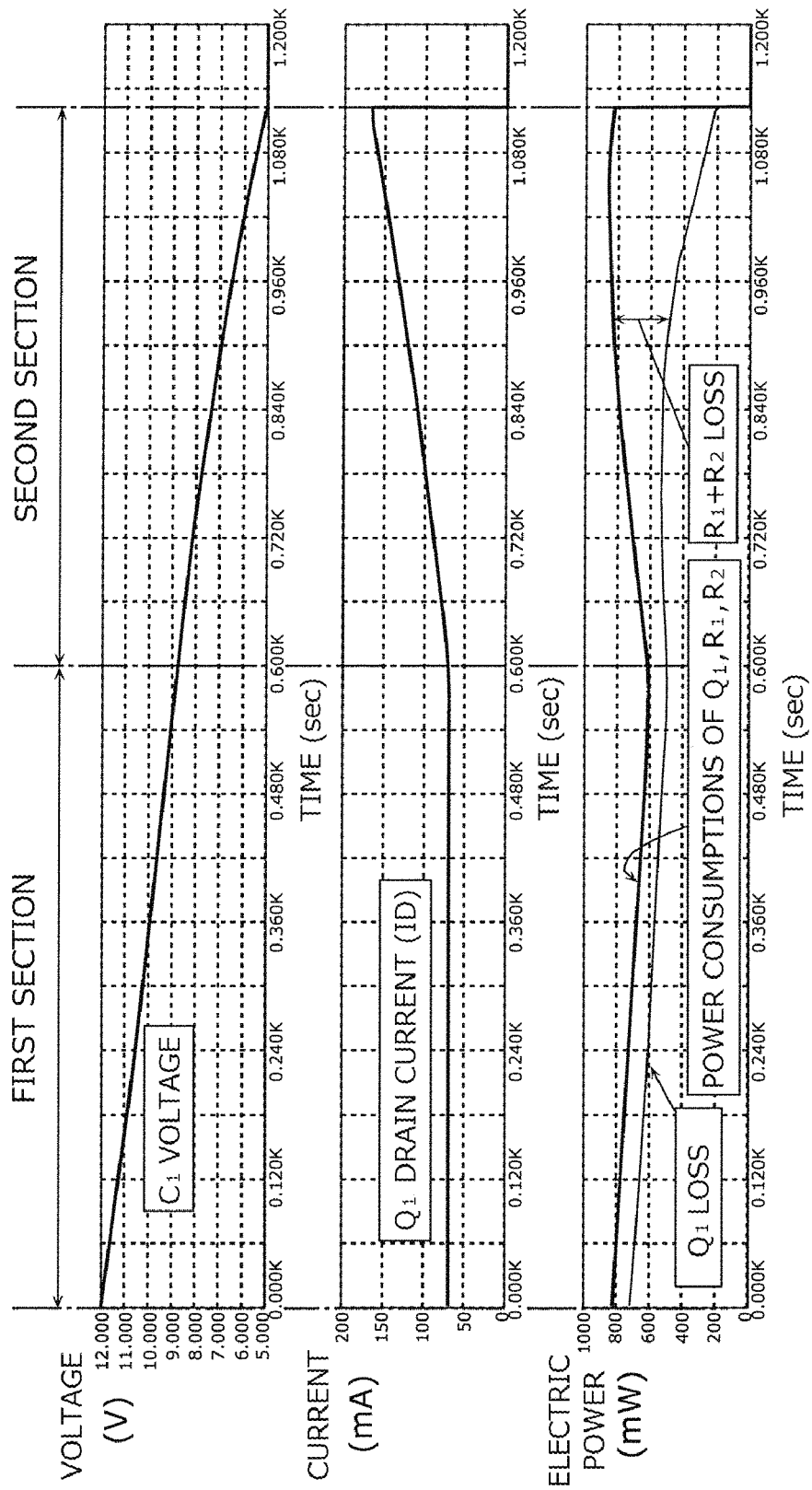
FIG. 3 is a graph showing simulation results of operation states for respective constituents of the power storage device and the discharge circuit according to the exemplary embodiment of the present disclosure.

FIG. 3 is a graph showing simulation results of operation states for respective constituents of power storage device 1 and discharge circuit 10. Upper part of FIG. 3 shows the voltage of capacitor $C_1$. Middle part of FIG. 3 shows the drain current $I_D$ of transistor $Q_1$. Lower part of FIG. 3 shows power consumptions of transistor $Q_1$, resistor $R_1$, and resistor $R_2$.

In the present exemplary embodiment, capacitor $C_1$ is constituted by five electric double layer capacitors each having the maximum charging voltage of 2.5 V which are connected to one another. In a fully charged state, capacitor $C_1$ is charged to 12 V (refer to the upper part of FIG. 3).

At this time, if breakdown voltage $V_Z$ of zener diode $ZD_1$ is set to 8.7 V; then a voltage more than or equal to breakdown voltage (8.7 V) is applied to zener diode $ZD_1$, and therefore, current I1 flows through zener diode $ZD_1$. Since resistors R8, R9 are connected in series to zener diode $ZD_1$, maximum current $I_{1max}$ flowing through zener diode $ZD_1$ is limited to about several milliamperes to several ten milliamperes.

Moreover, a Hi signal of a predetermined voltage (for example, 2.5 V) more than or equal to $V_{ref}$ is output from controller 20 to inverting input terminal (V−) of operational amplifier $IC_1$, and a zero voltage is output to the output terminal of operational amplifier $IC_1$. In this way, transistor $Q_1$ is turned off, and drain current $I_D$ of transistor $Q_1$ is zero.

In this state, the discharge of capacitor $C_1$ is started. First, switch $Q_4$ is turned off, whereby the supply of power to capacitor C is stopped.

In this case, as mentioned above, large current $I_{1max}$ is flowing through transistor $Q_3$ on the input side of current mirror circuit 15. Therefore, current $I_2$ ($\approx I_{1max}$) of substantially the same magnitude also flows through transistor $Q_2$ on the output side of current mirror circuit 15. This current $I_2$ is supplied from reference power supply REF, and accordingly, potential $V_{ER}$ of node ER of resistors $R_5$, $R_6$ becomes a value decreasing from reference voltage $V_{ref}$ by a voltage drop due to resistor $R_5$ ($V_{ER}=V_{ref}-I2\cdot R5$). Since current $I_2$ is large ($\approx I_{1max}$), potential $V_{ER}$ is reduced, and small voltage $V_{ER}$ is input to non-inverting input terminal (V+) of operational amplifier $IC_1$.

Here, from controller 20, a Low signal of a predetermined voltage (for example, 0 V) less than or equal to $V_{ref}$ is output to inverting input terminal (V−) of operational amplifier $IC_1$. In this way small voltage $V_{ER}$ is output to the output terminal of operational amplifier $IC_1$, and the same voltage is also input to the gate of transistor $Q_1$. As a result, transistor $Q_1$ is turned on, drain current $I_D$ starts to flow, and forced discharge of capacitor $C_1$ starts.

As when the discharge is started, when the voltage of capacitor $C_1$ is sufficiently larger than breakdown voltage $V_Z$ of zener diode $ZD_1$ ("first section" in the upper part of FIG. 3), current $I_1$ flowing through transistor $Q_3$ is maintained at large current value $I_{1max}$ due to the general feature of the zener diode mentioned above. Accordingly, current $I_2$ flowing through transistor $Q_2$ is also maintained at large current value $I_{1max}$ in a similar way. In this way, potential $V_{ER}$ of node ER and a potential of the output terminal of operational amplifier $IC_1$ are maintained at a predetermined low voltage. In this way, transistor $Q_1$ does not become a completely conductive state (full-on state), but as illustrated in the middle part of FIG. 3, drain current $I_D$ of transistor $Q_1$ is maintained at a small value.

When the discharge of capacitor $C_1$ progresses, and the voltage of capacitor $C_1$ gradually decreases and becomes smaller than breakdown voltage $V_Z$ of zener diode $ZD_1$ ("second section" in the upper part of FIG. 3), then current $I_1$ flowing through transistor $Q_3$ is reduced due to the general feature of the zener diode mentioned above. Following this reduction of current $I_1$, current $I_2$ flowing through transistor $Q_2$ is also reduced in a similar way, potential $V_{ER}$ of node ER and the potential of the output terminal of operational amplifier $IC_1$ are gradually increased to approach voltage $V_{ref}$ of the reference power supply. As a result, transistor $Q_1$ gradually approaches the full-on state, and as illustrated in the middle part of FIG. 3, drain current $I_D$ of transistor $Q_1$ is also increased.

While capacitor $C_1$ is being discharged, controller 20 measures the voltage of capacitor $C_1$. When capacitor $C_1$ reaches a preset discharge ending voltage (for example, 5 V), controller 20 outputs the Hi signal to inverting input terminal (V−) of operational amplifier $IC_1$. In this way transistor $Q_1$ is turned off, and the discharge of capacitor $C_1$ is ended.

[Effects]

As mentioned above, in discharge circuit 10 according to the present exemplary embodiment, as illustrated in the middle part and the lower part of FIG. 3, such constant current discharge in which the discharge current (drain current $I_D$) is controlled to a small value is performed in the first section where the voltage of capacitor $C_1$ is relatively high. In this way power losses in transistor $Q_1$ and resistors $R_1$, $R_2$ can be prevented from being increased excessively. In the second section where the voltage of capacitor $C_1$ is reduced, drain current $I_D$ is increased simultaneously with such a voltage drop of capacitor $C_1$. Accordingly, as illustrated in the lower part of FIG. 3, capacitor $C_1$ can be discharged such that the power losses in transistor $Q_1$ and resistors $R_1$, $R_2$ do not fluctuate largely. As described above, in the present exemplary embodiment, over the entire section of the discharge process of capacitor $C_1$, the power losses in transistor $Q_1$ and resistors $R_1$, $R_2$ do not fluctuate largely, and substantially constant discharge power is achieved.

That is, since capacitor $C_1$ can be discharged substantially evenly over the entire section of the discharge process, it is not necessary to use components specified adaptively to high power for transistor $Q_1$ and resistors $R_1$, $R_2$ which consume power of the discharge current. Hence, it is possible to reduce the size and cost of each of discharge circuit 10 and power storage device 1.

Moreover, in the present exemplary embodiment, zener diode $ZD_1$, resistors $R_5$ to $R_7$ and others are adjusted, whereby a discharge time of lowering the voltage of capacitor $C_1$ to a predetermined voltage can be controlled. For example, when breakdown voltage $V_Z$ of zener diode $ZD_1$ is increased, the first section is shortened. That is, switching to the second section is made earlier. In this way, the discharge time of capacitor $C_1$ can be shortened. Moreover, when a resistance value of resistor $R_5$ is reduced, then a difference between reference voltage $V_{ref}$ and voltage $V_{ER}$ at node ER is reduced. Accordingly, input voltage $V_{in}$ to non-inverting input terminal (V+) of operational amplifier $IC_1$ can be increased from the beginning of the discharge. In this way, drain current $I_D$ of transistor $Q_1$ in the first section can be increased, and the entire discharge time can be shortened.

Moreover, while FIG. 3 illustrates an example where the voltage of 12 V fully charged to capacitor $C_1$ is lowered to 5 V within 20 minutes, the discharge time can be controlled within a range where a deterioration of cells composing capacitor $C_1$ (electric double layer capacitors in the present exemplary embodiment) does not progress.

Furthermore, in the present exemplary embodiment, the discharge of capacitor $C_1$ is ended when capacitor $C_1$ reaches the preset discharge ending voltage. In this way, predetermined electric charges remain in capacitor $C_1$ at the point of time when the discharge is ended. Accordingly a deterioration of the cells due to complete discharge can be prevented, and a charging time in the case where capacitor $C_1$ is charged next can be shortened. The voltage left in capacitor $C_1$ is a voltage at which capacitor $C_1$ does not deteriorate even if being left. The voltage is appropriately decided in accordance with a type and usage of capacitor $C_1$. In the present exemplary embodiment, the voltage of capacitor $C_1$ when the discharge is ended is set to 5 V. In this case, a residual voltage per cell is 1 V; and the deterioration of the electric double layer capacitor is considered hard to occur.

Moreover, in the present exemplary embodiment, controller 20 is capable of measuring source voltage ES of transistor $Q_1$. For example, transistor $Q_1$ is in off state when capacitor C is charged by battery BATT, and therefore, originally, no voltage is generated in the source of transistor $Q_1$. However, when transistor $Q_1$ is broken and so on, transistor $Q_1$ is turned on, and a voltage is generated in the source. Moreover, transistor $Q_1$ is in on state when capacitor $C_1$ is discharged, and therefore, originally, a voltage is generated in the source of transistor $Q_1$. However, when transistor $Q_1$ is broken and so on, transistor $Q_1$ is turned off, and no voltage is generated in the source. As described above, when the unintended voltage is detected in the source of transistor $Q_1$ in the case of charging or discharging capacitor $C_1$, transistor $Q_1$ is considered to be broken. Hence, abnormalities of discharge circuit 10 and power storage device 1 can be detected by measuring source voltage ES of transistor $Q_1$.

The discharge circuit and the power storage device have been described above based on the exemplary embodiment. However, the present disclosure is not limited to the above exemplary embodiment. For example, the scope of the present disclosure should include modifications which those skilled in the art can obtain by adding various design changes to the exemplary embodiment described above, as well as modifications implemented by freely combining constituents and functions described in the exemplary embodiment without deviating from the spirit of the present disclosure.

For example, capacitor $C_1$ provided in power storage device 1 is not limited to the electric double layer capacitor, and may be an electrolytic capacitor or a secondary battery. Capacitor $C_1$ may be a single cell or may have a configuration in which plural cells are combined with one another. For example, capacitor $C_1$ may have a configuration in which plural cells connected in series are connected in parallel or a configuration in which plural cells connected in parallel are connected in series.

Power storage device 1 includes battery BATT. However, the present disclosure is not limited to this, and the battery may be replaced by a generator. Moreover, power storage device 1 may be mounted not only on the vehicle but also on a home or industrial electrical instrument. Furthermore, battery BATT may be placed outside the power storage device. At this time, battery BATT may be a commercial alternating-current power supply (AC power supply).

Moreover, power storage device 1 includes controller 20, but the present disclosure is not limited to this, and the controller may be placed outside the power storage device. For example, it is also possible to control power storage device 1 using an electronic control unit (ECU) mounted on the vehicle.

Moreover, discharge circuit 10 includes reference power supply REF for supplying current $I_2$ to transistor $Q_2$, but the present disclosure is not limited to this, and it is also possible to supply a current from the outside of discharge circuit 10.

What is claimed is:

1. A method for controlling a discharge of a power storage device, the power storage device including a power storage and a discharge circuit, the method comprising:
    a first step of discharging, in a first section of a discharging period, a part of an electric charge stored in the power storage through a first discharge path and a second discharge path which are included in the discharge circuit; and
    a second step of discharging, in a second section of the discharging period, a remaining part of the electric charge stored in the power storage through the second discharge path,
    wherein:
    the first discharge path includes a zener diode connected to one end of the power storage,
    the second discharge path includes a first transistor connected to the one end of the power storage at a first input terminal of the first transistor,
    the first section is a period in which a voltage of the one end of the power storage is higher than a breakdown voltage of the zener diode,
    the second section is a period in which a voltage of the one end of the power storage is lower than the breakdown voltage of the zener diode, and
    an output current of the first transistor in the second section is greater than an output current of the first transistor in the first section.

2. The method for controlling a discharge of a power storage device according to claim 1, wherein the output current of the first transistor in the second section increases as a voltage of the one end of the power storage decreases.

3. The method for controlling a discharge of a power storage device according to claim 2, wherein a current flowing through the zener diode in the first section is greater than the output current of the first transistor in the first section.

4. The method for controlling a discharge of a power storage device according to claim 2, wherein:
    the power storage device further includes a controller,
    the controller includes an input terminal for detecting the voltage of the one end of the power storage and an output terminal controlling an operation of the first transistor,
    a discharge through the second discharge path is started by a discharge starting signal emitted from the output terminal of the controller, and is ended by a discharge ending signal emitted from the output terminal of the controller,
    the discharge starting signal is emitted in the first section, and
    the discharge ending signal is emitted in the second section.

5. The method for controlling a discharge of a power storage device according to claim 2, wherein:
    the power storage device further includes a controller,
    the controller includes an input terminal for detecting the voltage of the one end of the power storage and an output terminal controlling an operation of the first transistor,
    the discharge circuit further includes an operational amplifier and a current mirror circuit,
    the operational amplifier controls the output current of the first transistor and is connected to a second input terminal of the first transistor,
    an output terminal of the current mirror circuit is connected to the operational amplifier,
    an input terminal of the current mirror circuit is connected to the one end of the power storage via the zener diode,
    the current mirror circuit includes a second transistor and a third transistor,
    an output terminal of the second transistor is connected to a first input terminal of the operational amplifier, and
    an input terminal of the third transistor is connected to the one end of the power storage via the zener diode.

6. The method for controlling a discharge of a power storage device according to claim 3, wherein:
    the power storage device further includes a controller,
    the controller includes an input terminal for detecting the voltage of the one end of the power storage and an output terminal controlling an operation of the first transistor,
    a discharge through the second discharge path is started by a discharge starting signal emitted from the output terminal of the controller, and is ended by a discharge ending signal emitted from the output terminal of the controller,
    the discharge starting signal is emitted in the first section, and
    the discharge ending signal is emitted in the second section.

7. The method for controlling a discharge of a power storage device according to claim 3, wherein:
    the power storage device further includes a controller,
    the controller includes an input terminal for detecting the voltage of the one end of the power storage and an output terminal controlling an operation of the first transistor, the discharge circuit further includes an operational amplifier and a current mirror circuit, the operational amplifier controls the output current of the first transistor and is connected to a second input terminal of the first transistor, an output terminal of the current mirror circuit is connected to the operational amplifier, an input terminal of the current mirror circuit is connected to the one end of the power storage via the zener diode, the current mirror circuit includes a second transistor and a third transistor, an output terminal of the second transistor is connected to a first input terminal of the operational amplifier, and an input terminal of the third transistor is connected to the one end of the power storage via the zener diode.

8. The method for controlling a discharge of a power storage device according to claim 4, wherein:

the power storage device further includes a controller, the controller includes an input terminal for detecting the voltage of the one end of the power storage and an output terminal controlling an operation of the first transistor, the discharge circuit further includes an operational amplifier and a current mirror circuit, the operational amplifier controls the output current of the first transistor and is connected to a second input terminal of the first transistor, an output terminal of the current mirror circuit is connected to the operational amplifier, an input terminal of the current mirror circuit is connected to the one end of the power storage via the zener diode, the current mirror circuit includes a second transistor and a third transistor, an output terminal of the second transistor is connected to a first input terminal of the operational amplifier, and an input terminal of the third transistor is connected to the one end of the power storage via the zener diode.

9. The method for controlling a discharge of a power storage device according to claim 6, wherein:

the power storage device further includes a controller, the controller includes an input terminal for detecting the voltage of the one end of the power storage and an output terminal controlling an operation of the first transistor, the discharge circuit further includes an operational amplifier and a current mirror circuit, the operational amplifier controls the output current of the first transistor and is connected to a second input terminal of the first transistor, an output terminal of the current mirror circuit is connected to the operational amplifier, an input terminal of the current mirror circuit is connected to the one end of the power storage via the zener diode, the current mirror circuit includes a second transistor and a third transistor, an output terminal of the second transistor is connected to a first input terminal of the operational amplifier, and an input terminal of the third transistor is connected to the one end of the power storage via the zener diode.

10. The method for controlling a discharge of a power storage device according to claim 1, wherein a current flowing through the zener diode in the first section is greater than the output current of the first transistor in the first section.

11. The method for controlling a discharge of a power storage device according to claim 10, wherein:

the power storage device further includes a controller, the controller includes an input terminal for detecting the voltage of the one end of the power storage and an output terminal controlling an operation of the first transistor, a discharge through the second discharge path is started by a discharge starting signal emitted from the output terminal of the controller, and is ended by a discharge ending signal emitted from the output terminal of the controller, the discharge starting signal is emitted in the first section, and the discharge ending signal is emitted in the second section.

12. The method for controlling a discharge of a power storage device according to claim 10, wherein:

the power storage device further includes a controller, the controller includes an input terminal for detecting the voltage of the one end of the power storage and an output terminal controlling an operation of the first transistor, the discharge circuit further includes an operational amplifier and a current mirror circuit, the operational amplifier controls the output current of the first transistor and is connected to a second input terminal of the first transistor, an output terminal of the current mirror circuit is connected to the operational amplifier, an input terminal of the current mirror circuit is connected to the one end of the power storage via the zener diode, the current mirror circuit includes a second transistor and a third transistor, an output terminal of the second transistor is connected to a first input terminal of the operational amplifier, and an input terminal of the third transistor is connected to the one end of the power storage via the zener diode.

13. The method for controlling a discharge of a power storage device according to claim 11, wherein:

the power storage device further includes a controller, the controller includes an input terminal for detecting the voltage of the one end of the power storage and an output terminal controlling an operation of the first transistor, the discharge circuit further includes an operational amplifier and a current mirror circuit, the operational amplifier controls the output current of the first transistor and is connected to a second input terminal of the first transistor, an output terminal of the current mirror circuit is connected to the operational amplifier, an input terminal of the current mirror circuit is connected to the one end of the power storage via the zener diode, the current mirror circuit includes a second transistor and a third transistor, an output terminal of the second transistor is connected to a first input terminal of the operational amplifier, and an input terminal of the third transistor is connected to the one end of the power storage via the zener diode.

14. The method for controlling a discharge of a power storage device according to claim 1, wherein:

the power storage device further includes a controller, the controller includes an input terminal for detecting the voltage of the one end of the power storage and an output terminal controlling an operation of the first transistor, a discharge through the second discharge path is started by a discharge starting signal emitted from the output terminal of the controller, and is ended by a discharge ending signal emitted from the output terminal of the controller, the discharge starting signal is emitted in the first section, and the discharge ending signal is emitted in the second section.

15. The method for controlling a discharge of a power storage device according to claim 14, wherein:

the power storage device further includes a controller, the controller includes an input terminal for detecting the voltage of the one end of the power storage and an output terminal controlling an operation of the first transistor, the discharge circuit further includes an operational amplifier and a current mirror circuit, the operational amplifier controls the output current of the first transistor and is connected to a second input terminal of the first transistor, an output terminal of the current mirror circuit is connected to the operational amplifier, an input terminal of the current mirror circuit is connected to the one end of the power storage via the zener diode, the current mirror circuit includes a second transistor and a third transistor, an output terminal of the second transistor is connected to a first input terminal of the operational amplifier, and an input terminal of the third transistor is connected to the one end of the power storage via the zener diode.

16. The method for controlling a discharge of a power storage device according to claim 1, wherein:

the power storage device further includes a controller, the controller includes an input terminal for detecting the voltage of the one end of the power storage and an output terminal controlling an operation of the first transistor, the discharge circuit further includes an operational amplifier and a current mirror circuit, the operational amplifier controls the output current of the first transistor and is connected to a second input terminal of the first transistor, an output terminal of the current mirror circuit is connected to the operational amplifier, an input terminal of the current mirror circuit is connected to the one end of the power storage via the zener diode, the current mirror circuit includes a second transistor and a third transistor, an output terminal of the second transistor is connected to a first input terminal of the operational amplifier, and an input terminal of the third transistor is connected to the one end of the power storage via the zener diode.

17. A method for controlling a discharge of a power storage device, the power storage device including a power storage, a controller and a discharge circuit, the method comprising:

a first step of discharging, in a first section of a discharging period, a part of an electric charge stored in the power storage through a first discharge path and a second discharge path which are included in the discharge circuit; and a second step of discharging, in a second section of the discharging period, a remaining part of the electric charge stored in the power storage through the second discharge path, wherein:

the first discharge path includes a zener diode connected to one end of the power storage, the second discharge path includes a first transistor connected to the one end of the power storage at a first input terminal of the first transistor, the controller includes an input terminal for detecting the voltage of the one end of the power storage and an output terminal controlling an operation of the first transistor, the discharge circuit further includes an operational amplifier and a current mirror circuit, the operational amplifier controls an output current of the first transistor and is connected to a second input terminal of the first transistor, an output terminal of the current mirror circuit is connected to the operational amplifier, an input terminal of the current mirror circuit is connected to the one end of the power storage via the zener diode, the current mirror circuit includes a second transistor and a third transistor, an output terminal of the second transistor is connected to a first input terminal of the operational amplifier, and an input terminal of the third transistor is connected to the one end of the power storage via the zener diode, the first section is a period in which a voltage of the one end of the power storage is higher than a breakdown voltage of the zener diode, the second section is a period in which a voltage of the one end of the power storage is lower than the breakdown voltage of the zener diode, and a current flowing through the zener diode in the first section is greater than the output current of the first transistor in the first section.

18. The method for controlling a discharge of a power storage device according to claim 17, wherein:

the power storage device further includes a controller, the controller includes an input terminal for detecting the voltage of the one end of the power storage and an output terminal controlling an operation of the first transistor, a discharge through the second discharge path is started by a discharge starting signal emitted from the output terminal of the controller, and is ended by a discharge ending signal emitted from the output terminal of the controller, the discharge starting signal is emitted in the first section, and the discharge ending signal is emitted in the second section.

19. The method for controlling a discharge of a power storage device according to claim 18, wherein:

the power storage device further includes a controller, the controller includes an input terminal for detecting the voltage of the one end of the power storage and an output terminal controlling an operation of the first transistor, the discharge circuit further includes an operational amplifier and a current mirror circuit, the operational amplifier controls the output current of the first transistor and is connected to a second input terminal of the first transistor, an output terminal of the current mirror circuit is connected to the operational amplifier, an input terminal of the current mirror circuit is connected to the one end of the power storage via the zener diode, the current mirror circuit includes a second transistor and a third transistor, an output terminal of the second transistor is connected to a first input terminal of the operational amplifier, and an input terminal of the third transistor is connected to the one end of the power storage via the zener diode.

* * * * *